(12) United States Patent
Fritze et al.

(10) Patent No.: US 7,306,881 B2
(45) Date of Patent: Dec. 11, 2007

(54) METHOD AND SYSTEM OF LITHOGRAPHY USING MASKS HAVING GRAY-TONE FEATURES

(75) Inventors: Michael Fritze, Acton, MA (US); Brian Tyrrell, Pawtucket, RI (US)

(73) Assignee: Massachusetts Institute of Technology, Cambridge, MA (US)

( * ) Notice: Subject to any disclaimer, the term of this patent is extended or adjusted under 35 U.S.C. 154(b) by 713 days.

(21) Appl. No.: 10/855,546

(22) Filed: May 27, 2004

(65) Prior Publication Data
US 2004/0259042 A1 Dec. 23, 2004

Related U.S. Application Data

(62) Division of application No. 10/234,783, filed on Sep. 4, 2002, now Pat. No. 6,884,551.

(60) Provisional application No. 60/361,612, filed on Mar. 4, 2002.

(51) Int. Cl.
*G03F 1/00* (2006.01)
(52) U.S. Cl. .......................................................... 430/5
(58) Field of Classification Search .................... 430/5, 430/30; 716/19–21
See application file for complete search history.

(56) References Cited

U.S. PATENT DOCUMENTS

| 4,902,899 | A | 2/1990 | Lin et al. |
|---|---|---|---|
| 5,415,835 | A | 5/1995 | Brueck et al. |
| 5,635,316 | A | 6/1997 | Dao |
| 5,858,580 | A | 1/1999 | Wang et al. |
| 6,114,071 | A | 9/2000 | Chen et al. |
| 6,238,850 | B1 | 5/2001 | Bula et al. |
| 6,312,854 | B1 | 11/2001 | Chen et al. |
| 6,416,907 | B1 * | 7/2002 | Winder et al. .................. 430/5 |
| 2001/0041306 | A1 | 11/2001 | Cole et al. |

FOREIGN PATENT DOCUMENTS

WO   WO 01/25852   4/2001

OTHER PUBLICATIONS

"Simulation Assisted Design of Processes for Gray-tone Lithography," Henke et al. *Microelectronic Engineering*. 1995. vol. 27, p. 267-270.
"Refractive Micro Lens Made of Dichromate Gelatin with Gray-tone Photolithography," Yao et al. *Microelectronic Engineering*. 2001. vol. 57-58. p. 729-735.

* cited by examiner

*Primary Examiner*—S. Rosasco
(74) *Attorney, Agent, or Firm*—Gauthier & Connors LLP

(57) ABSTRACT

A method forms patterns on a substrate by exposing the substrate a first time and exposing the substrate a second time using a mask containing gray-tone features. The gray-tone features locally adjust an exposure dose in regions corresponding to features defined in the primary exposure. Moreover, the gray-tone features enable the forming of features having different critical dimensions on a substrate. The gray-tone features may be sub-resolution features and formed by pixellation. The trim mask containing gray-tone features may have regions with different transmissivities.

29 Claims, 10 Drawing Sheets

METHOD AND SYSTEM OF LITHOGRAPHY USING MASKS HAVING GRAY-TONE FEATURES

CROSS-REFERENCE TO RELATED PROVISIONAL APPLICATION

The present patent application claims priority under 35 U.S.C. § 119 from U.S. Provisional Patent Application Ser. No. 60/361,612 filed on Mar. 4, 2002. The entire contents of U.S. Provisional Patent Application Ser. No. 60/361,612 filed on Mar. 4, 2002 are hereby incorporated by reference.

CROSS-REFERENCE TO RELATED UTILITY APPLICATION

The present patent application is a divisional application of U.S. Ser. No. 10/234,783 which was filed on Sep. 4, 2002 now U.S. Pat. No. 6,884,551. The entire content of U.S. Ser. No. 10/234,783 which was filed on Sep. 4, 2002 is hereby incorporated by reference.

SPONSORSHIP INFORMATION

This invention was made with government support under Contract Number F19628-00-C-0002 awarded by the Air Force. The government has certain rights in the invention.

FIELD OF THE PRESENT INVENTION

The present invention is directed to fabrication methods, such as double exposure lithography, which initially form a pattern on a substrate and then trims the formed pattern. More particularly, the present invention is directed to a process and methodology of controlling feature critical dimension using gray-tone mask features.

BACKGROUND OF THE PRESENT INVENTION

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc) has been built up around this technology.

In this process, a mask, or "reticle", includes a semiconductor circuit layout pattern typically formed of opaque chrome, on a transparent glass (typically $SiO_2$) substrate. A stepper includes a light source and optics/lenses that project light coming through the reticle and image the circuit pattern, typically with a 4× to 5× reduction factor, on a photo-resist film formed on a silicon wafer. The term chrome refers to an opaque masking material that is typically but not always comprised of chrome. The transmission of the opaque material may also vary such as in the case of an attenuating phase shift mask.

FIG. 1 is an example of a conventional optical projection lithography apparatus. As illustrated in FIG. 1, the optical projection lithography apparatus includes a light source 20, a photomask 22, and reduction optics 24. A wafer 26, having a layer of photo-resist 28 thereon, is placed within the optical projection lithography apparatus, and the light-source 20 generates a beam of light 21 that is incident upon the photomask 22. The reduction optics 24 projects the light beam to cause a pattern 30 that exposes the photo-resist layer 28, creating the pattern 30 of reacted material in the resist layer 28. In this manner, a pattern 32, provided on the mask 22, is transferred to the photo-resist layer 28 on the wafer 26.

The photo-resist pattern 30 is then transferred to the underlying wafer 26 through standard etching processes using standard semiconductor fabrication techniques. Both positive and negative tone resists can be used to produce either positive or negative images of the mask pattern on the wafer.

An example of a phase shift mask is illustrated in FIGS. 2 and 3. As illustrated in FIGS. 2 and 3, a dense-feature mask example 220 is a phase-shift mask comprising a grating pattern of periodic features. It is noted that a dense grating pattern is only one example of a dense-feature mask. FIGS. 2 and 3 are top and side views, respectively, of the phase-shift mask 220. The phase-shift mask 220 may be formed of, for example, fused $SiO_2$. Periodic trenches 23 are formed in the mask 220 to provide an interference pattern upon illumination that results in the desired photoresist pattern 30 on the wafer 26.

In the chromeless phase shift mask 220, periodic features or trenches 23 are typically etched into the transparent mask material, which is typically quartz. The depth of these etched features 23 results in a relative phase difference in the illumination that is transmitted on either side of a phase boundary 36. When the relative phase difference is 180 degrees, an interference null corresponding to the phase edge 36 is produced at the image plane, which is typically the wafer or substrate 26. It is noted that chromeless phase shift masks illustrated here are only one type of phase shift mask. There are many other types of phase shift masks.

As the semiconductor industry continues to evolve and grow, feature sizes of the pattern are driven to an ever-smaller resolution. The driving force is the desire of these industries to remain on the "Moore's Law" growth curve. The "Moore's Law" growth curve calls for an exponential increase of circuit density versus production year that is typically accomplished by decreasing feature sizes. However, the resolution of an optical stepper is limited by the wavelength of the light source, and is further limited by the numerical aperture ("NA") of the lens.

The basic lithographic imaging relationships are:

1) Resolution=$k_1 \lambda$/NA; and
2) Depth of Focus=$k_2 \lambda/(NA)^2$;

where $\lambda$ is the illumination wavelength, NA is the lens numerical aperture, and $k_1$ and $k_2$ are process constants.

In general, a shorter wavelength light source and/or a higher numerical aperture lens afford a higher-resolution system. State-of-the-art light sources provide a beam having a wavelength of approximately 193 nanometers. As stated above, the semiconductor industry has been driving the need for critical feature sizes to decrease exponentially over time, while exposure light source wavelengths have only been decreasing linearly with time.

Carrying this scenario forward, current and future optical lithography will be required to image feature sizes of sub-wavelength dimensions. Sub-wavelength optical lithography has been introduced with the 180-nm Node device generation, fabricated using 248-nm optical lithography.

As noted above, the numerical aperture of the lens also drives resolution. In this field, the cost of lenses having very high numerical apertures ("NA") approaching 0.9 to 1.0 is very high. Moreover, linear NA increases are not sufficient to maintain pace with the need for exponentially decreasing feature sizes.

To meet this demand, Resolution-Enhanced optical lithography Technologies ("RET") have become popular as techniques for providing patterns with sub-wavelength resolution. These methods include off-axis illumination ("OAI"), optical proximity correction ("OPC"), and phase-shift masks ("PSMs"). Such resolution-enhanced optical lithography methods are especially useful for generating physical devices on a wafer that require small size and tight design tolerance. Examples of such physical devices are the gate length of a transistor or the dimensions of contact cuts formed in inter-layer dielectrics. However, the conventional RET methods face problems of layout complexity and data size, mask fabrication complexity and resulting cost, and optical proximity and spatial frequency effects which are discussed below.

In many circuit applications, it is an important design constraint that the respective sizes of the narrow lines are consistent throughout the circuit. For example, in a semiconductor device, the narrow lines may form transistor gates, and it is important that the transistor gates are similar in size so that the circuit has consistent and predictable gate delay values.

In general, in any optical lithography technique, the resulting optical image intensity is a function of the proximity of features. Contrast is lost as feature pitch values decrease. As a result, the resulting size of features located in densely populated regions can be different than the size for those features that are isolated from the densely populated features. This is known as the "optical proximity" effect.

With respect to optical proximity effect, the critical dimension of features depends on feature density. Moreover, optical proximity effects can become more severe in sub-wavelength lithography. The optical proximity effects can result in dense lines 261 and an isolated line 262 on wafer 26 being printed with different sizes, even if the same size on the mask, as illustrated in FIG. 4, or dense contacts 263 and an isolated contact 264 on wafer 26 being printed with different sizes, even if the same size on the mask, as illustrated in FIG. 5. Since the performance of the circuit depends on the size and size tolerance of the gates, this is an undesirable result.

Spatial frequency effects are caused by the "low-pass filter" behavior of a projection lithography lens wherein high spatial frequencies do not pass through the lens. This results in corner rounding and line end shortening. An example of this effect is illustrated in FIG. 6. As illustrated in FIG. 6, a desired image is represented by mask 2200, but the actual image pattern 265 on the wafer is shortened and rounded.

To compensate for optical proximity and spatial frequency effects, additional features have been conventionally introduced on the mask that can involve both printable as well as sub-resolution elements. In these methods, extra features such as serifs, mousebites, hammerheads, and scattering bars are added to the mask features in order to correct for optical proximity effects and other spatial frequency effects. These conventional methods involve sophisticated algorithms with very large data size, as different corrections are required for each separation distance between the features. For this reason, conventional feature size correction ("OPC" or optical proximity correction) is a costly and time-consuming process.

Conventional OPC generally involves the processing of an enormous data volume. The hierarchical data processing algorithms used for conventional circuit design are of limited utility because optical proximity effects are based on the nature of geometries surrounding a particular circuit element. For example, a 1× AND gate surrounded by registers on all sides will perform differently than a 1× AND gate surrounded by other 1× AND gates. Other examples of conventional lithography methods addressing the need for finer features or higher-resolution features will be discussed below.

U.S. Pat. No. 5,415,835-B1 ("Brueck et al.") discusses a method of fine-line imaging based on laser interferometry. In Brueck et al., dense gratings formed by laser interferometry are customized by additional exposures using both interferometric and conventional lithography. Brueck et al. does not address optical proximity and spatial frequency effect problems thus limiting the ultimate density and flexibility of the patterns produced. In addition, the multiple exposures are not substantially independent in the optical sense due to the resist's "memory" of previous exposure patterns. It is also difficult to make an arbitrary two-dimensional pattern in this way.

EP-0915384-A2 ("Suzuki et al.") expands upon interferometric lithography. Suzuki et al. discloses using interferometric one-dimensional gratings to realize fine-line lithography together with subsequent customization exposures using multiplex (sub-threshold) exposure doses. Suzuki et al. does not address optical proximity and spatial frequency effect problems thus limiting the ultimate density and flexibility of the patterns produced. The multiple exposures are not substantially optically independent due to the resist's "memory" of the previous exposures. It is also difficult to realize an arbitrary 2D pattern with this method. Since the fine features are only realized in one orientation, it is difficult to form patterns with fine features in both the x & y directions.

WO-1/06320-A1 ("Levenson") discloses re-usable "master" fine feature phase-shift masks that can be customized by multiple exposure methods using conventional masks. Levenson discloses a "trade-off between a maximum density of features against the cost for low volume runs". Thus, the target application is primarily ASIC and thin-film head patterns where the pattern density is not too great. Just as in the previous Patents discussed above, this method does not mitigate optical proximity and spatial frequency effects. It does not include substantially independent multiple exposures.

Finally, U.S. Pat. No. 6,184,151-B1 ("Adair et al.") discloses a method for forming square shape images wherein a first plurality of lines running in a first direction is defined in a first layer, and then a second resist is defined wherein the lines run in an intersecting pattern to those of the first layer, thereby creating sharp corners wherever the first and second layers intersect and in open areas between the lines. This process addresses the spatial frequency effect problems of corner rounding and line-end shortening, but does not resolve the optical proximity effect problem. The control of fine features through pitch is important in order to realize the maximum pattern density and flexibility for applications.

One of the most common commercial implementations of phase shift mask technology is the double exposure method. In this method, the critical features are imaged using a phase shift mask and the non-critical and trim features are imaged in a second exposure using a conventional chrome-on-glass mask.

An example of a double exposure phase shift method is illustrated in FIG. 7. Double exposure imaging has become an accepted method in the field of resolution enhancement lithography.

In this method, fine features 42 are typically imaged on the substrate 26 in the first exposure, using a phase shift mask 31, and definition of other features 204 and trimming of undesired phase edges are performed in a second exposure using a trim mask 38. The phase shift mask may contain additional opaque features 203.

A typical double exposure phase shift method uses a conventional chrome-on-glass binary photomask for the trim mask 38. In this case, chrome regions 40 on the trim mask 38 prevent desired features produced by the phase shift mask 31 from being exposed in the trim exposure.

Multiple critical dimensions are typically formed by varying the width of a chrome regulator structure 201 placed at each phase edge 36, as is illustrated in the mask of FIGS. 8 and 9.

More specifically, an alternating aperture phase shift mask, which has chrome regulators at each phase edge, is illustrated in FIGS. 8 and 9. FIG. 8 is a top view and FIG. 9 is a cross sectional view. Unlike the chromeless phase shift mask, the alternating aperture phase shift mask 122 has chrome regulators 201 placed at each phase edge 36.

Phase shift masks work by employing the principle of destructive interference of light to generate fine dark lines in photoresist. A phase shift photomask is typically made of quartz ($SiO_2$) in which features are etched to a depth corresponding to a 180-degree phase difference for the illumination light wavelength used. The equation for determining etch depth for optimum destructive interference is:

$$d = \lambda/2(n-1) \quad \quad 1)$$

where d is the etch depth, $\lambda$ is the exposure wavelength and n is the index of refraction of the glass mask at the exposure wavelength.

Upon illumination by the lithography apparatus as shown in FIG. 1, each feature edge 36 forms a fine dark line in the photoresist 28. Note that since these dark line features correspond to phase boundaries 36, these dark line features are topologically closed which has lead to the development of double exposure phase shift methods in order to trim away the undesired fine lines in a second exposure.

In this process, the critical features are imaged using a phase shift mask and non-critical and trim features are imaged in a second exposure using a conventional chrome-on-glass mask. One of the challenges of this approach is the imaging of a variety of near minimum width feature sizes, by varying widths of chrome regulator features at each phase transition.

As feature sizes continue to scale into the deep sub-wavelength regime, it becomes more difficult to fabricate multiple sizes of critical dimension features by varying chrome regulator width. In addition, state of the art chromeless phase shift lithography methods, which are capable of the largest resolution enhancement, cannot be used to image multiple fine feature critical dimensions in a single die.

Another example of a double exposure method is disclosed in U.S. Pat. No. 5,858,580 (Wang et al.). Wang et al. discloses creating a phase shifting mask and a structure mask for shrinking integrated circuit designs. One disclosed embodiment includes using a two-mask process. The first mask is a phase shift mask and the second mask is a single-phase structure mask. The phase shift mask primarily defines regions requiring phase shifting. The single-phase structure mask primarily defines regions not requiring phase shifting. The single-phase structure mask also prevents the erasure of the phase shifting regions and prevents the creation of undesirable artifact regions that would otherwise be created by the phase shift mask.

As feature sizes continue to move ever deeper into the sub-wavelength regime, it becomes increasingly difficult to image a variety of critical dimensions using this method. In addition, chromeless phase shift masks, which have great resolution enhancement potential, cannot be used to image multiple critical dimensions The methods discussed above are also applicable to the case where fine features are defined using interferometric processes or using nanoimprint processes. In interferometric technology, a substrate is exposed interferometrically, using two or more coherent illumination sources to generate an interference pattern on the substrate. In nanoimprint technology, a topographic pattern on a master template is transferred to a substrate by direct mechanical contact.

It is therefore desirable to develop a method that mitigates optical proximity and spatial frequency effects without adding complex optical proximity correction features to the mask, while preserving the resolution enhancement aspects required by sub-wavelength lithography. This is especially desirable since conventional optical proximity correction approaches are becoming quite difficult to implement as imaging requirements continue to move deeper into the sub-wavelength regime.

It is also desirable to eliminate basic optical proximity effects, involving the defining or forming of fine lines in the x and y directions through a variety of pitch values and to minimize spatial frequency effects such as corner rounding and line-end shortening.

It is further desirable to simplify circuit layout and mask fabrication, resulting in lower cost and substantially decreased data volume required for a typical design, thereby allowing for design of standard cells that can be accurately characterized independently of their eventual placement in a larger circuit.

Moreover, it is desirable to develop a method that incorporates sub-resolution features to allow for lithographic definition of features with locally variable critical dimension, which can be used in a variety of lithographic processes, such as phase shift lithography, interferometric lithography, or nanoimprint technology.

It is also desirable to provide local control of the effective exposure dose that defines the critical dimension of the feature so that a wide variety of small features can be imaged without the need for chrome regulators or additional exposures.

Lastly, it is desirable to develop a method that incorporates sub-resolution features to allow for lithographic definition of features with locally variable critical dimension, which can be used in customizing a master pattern on an individual substrate wherein the master pattern was formed using a master template and nanoimprint technology.

SUMMARY OF THE PRESENT INVENTION

One aspect of the present invention is a method of forming a pattern on a substrate. The method forms a pattern on a substrate and exposes the substrate using a mask containing gray-tone features.

Another aspect of the present invention is a method of designing a mask in which a primary exposure is assumed. The method places gray-tone features on a layout of the mask to locally adjust an exposure dose in regions corresponding to features defined in the primary exposure and places other features on the layout of the mask.

A further aspect of the present invention is a trim mask having gray-tone features.

A fourth aspect of the present invention is a method of forming a feature having a critical dimension on a substrate. The method exposes the substrate using a mask containing gray-tone features.

A fifth aspect of the present invention is a mask set for a process for providing patterns on a substrate. The mask set includes a fine feature mask containing a pattern of dense features and a trim mask containing gray-tone features to produce multiple trimmed patterns of fine features.

A sixth aspect of the present invention is a method of forming a random contact array on a substrate. The method exposes the substrate to provide a pattern of dense contact features of a predetermined pitch and critical dimension and exposes the substrate with a trim mask containing gray-tone features to provide multiple trimmed patterns on the substrate, the trimmed patterns including both densely populated and sparsely populated regions of features, the critical dimension of the features in the densely populated regions and sparsely populated regions being substantially independent of feature density.

A seventh aspect of the present invention is a mask set for a process for providing patterns on a substrate. The mask set includes a fine feature mask and a trim mask containing gray-tone features to produce multiple trimmed patterns of fine features.

An eighth aspect of the present invention is a method of forming patterns on a substrate. The method produces fine features using nanoimprint methods and exposes the substrate using a mask containing gray-tone features.

A ninth aspect of the present invention is a computer aided design method for designing a mask. The method specifies, through an input of a user, a geometric property of a desired substrate feature and determines automatically, based upon the user specified geometric property of the desired substrate feature, mask features for a gray-tone mask.

A tenth aspect of the present invention is a method of forming a pattern on a substrate. The method imprints a pattern on a substrate and exposes the substrate to change the imprinted pattern.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
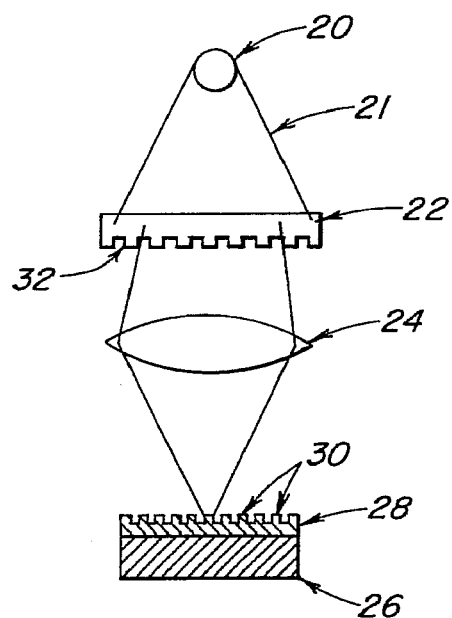
FIG. 1 is a schematic of a prior art optical projection lithography apparatus.

The present invention is directed to an imaging approach that overcomes the limitations of the conventional techniques, and confers a number of advantages. It addresses the problems of optical proximity and spatial frequency effects while maintaining the resolution-enhancement performance required by sub-wavelength lithography. Moreover, the present invention addresses the problems associated with lithographically defining features with locally variable critical dimension. The present invention also provides local control of the effective exposure dose that defines the critical dimension of the feature so that a wide variety of small features can be imaged without the need for chrome regulators or additional exposures.

In the following description, the phrase, "lines," refers to either the trenches or the raised areas; e.g., plateaus; on a wafer. Moreover, the phrase, "contacts," refers to either the holes or pillars on a wafer. The described photoresists may either be a negative tone or a positive tone. The descriptions are applicable to either positive or negative imaging of the wafer or substrate.

With respect to spatial frequency effects and optical proximity effects, any image that is lithographically exposed can be thought of in Fourier space, where components of various spatial frequencies sum to form the complete image.

The lens acts as a low-pass filter because it has a finite aperture. Spatial frequency effects cause corner rounding and line-end shortening because higher diffraction orders are filtered out. Optical proximity effects cause the same features spatially apart from each other on a substrate to realize a size differential even though these features were formed using the same mask feature size. This effect is typically described quantitatively in terms of critical dimension versus pitch.

Lastly, the phrase, "dense features," refers to an area on the substrate having a multitude of features positioned very closely to each other.

In describing the concepts of the present invention below, examples primarily directed to double exposure photolithography have been used. However, it is noted that the various below described concepts of the present invention are also applicable to the case where fine features are defined using interferometric processes or using nanoimprint processes. In interferometric technology, a substrate is exposed interferometrically, using two or more coherent illumination sources to generate an interference pattern on the substrate. In nanoimprint technology, a topographic pattern on a master template is transferred to a substrate by direct mechanical contact.

In the present invention, a mask is provided including a dense repetitive structure of features that results in a large array of densely populated features on the film or substrate. The pattern of dense features may be locally or globally periodic. The mask is designed to print dense features near the resolution limit of the lithography stepper used, thus defining a pattern "grid." The minimum width features (such as transistor gates and contacts) are laid out on this grid. The allowed feature grid locations are integer multiples of the minimum grid pitch.

Using this mask, the substrate is exposed to provide a pattern of regular dense features of a predetermined pitch and critical dimension. Following this first dense feature formation exposure, a trimming exposure is performed to remove any unwanted pattern features.

It is noted that a pattern of regular dense features of a predetermined pitch and critical dimension can be formed using interferometric lithography, and a trimming exposure is performed, thereafter, to remove any unwanted pattern features.

It is further noted that the present invention may utilize a template and nanoimprinting to create a pattern of dense features having a predetermined pitch and critical dimension, the pattern of dense features may be locally or globally periodic. In this embodiment, a trimming exposure is performed to remove any unwanted pattern features.

Optionally, an additional exposure is performed, adding further features as well as interconnecting the previously formed features to form a circuit. This exposure is substantially independent of the previous exposures, thus minimizing effects such as spatial frequency effects (corner rounding and line end shortening).

For example, when using less general dense fine feature masks, only two exposures are necessary: dense-grating and trim. On the other hand if a simple one-dimensional grating mask is used, three exposures are required: dense-grating, trim, and interconnect. In addition to the grid layout restriction, this particular embodiment also requires the minimum width features to be oriented in the same direction.

In the present invention, all small features are generated using the exact same density optical image patterns; and therefore, maximum consistency between features is established. The small features may comprise gates of transistors or contact holes. Small features are thus produced without the proximity effects realized by the conventional techniques using simple, reusable dense-grating masks. Customized and less expensive trimming masks can then be used to complete the desired pattern as well as interconnect the circuit components.

In this manner, only a single dense-grating is required for generating any of a number of different circuits and patterns. The re-usability of the dense-grating mask is desirable since this is often the most difficult and expensive mask to fabricate. This is especially true if the dense grating mask is a phase-shift mask. A phase-shift mask is capable of imaging dense features very close to the Rayleigh limit for optical projection steppers. ($Pitch_{MIN}=0.5\lambda/(NA)$). Dense regular patterns also are routinely obtained using interference lithography.

As noted above, FIG. 1 is a schematic block diagram of a conventional optical projection lithography apparatus. The conventional optical projection lithography apparatus includes a light source 20, a photomask 22, and reduction optics 24. A wafer 26 having a layer of photoresist 28 is presented to the conventional optical projection lithography apparatus, and the light-source 20 generates a beam of light 21 that is incident upon the photomask 22 and reduced by reduction optics 24 to cause a pattern 30 to be exposed in the photoresist layer 28. In this manner, a pattern 32 provided on the mask 22 is transferred to the photoresist layer 28 on the wafer 26.

Figure 2:
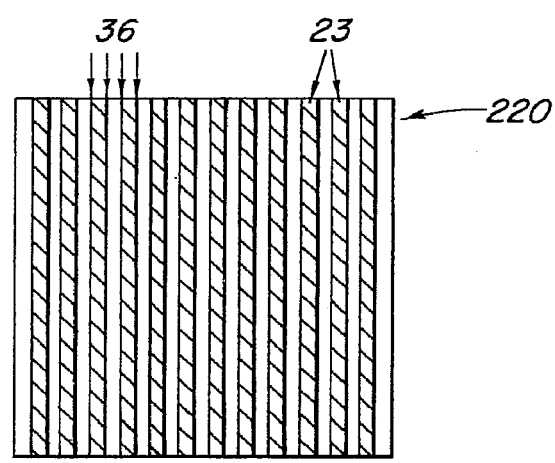
FIG. 2 is a top view schematic of a chromeless phase shift mask.
Figure 3:
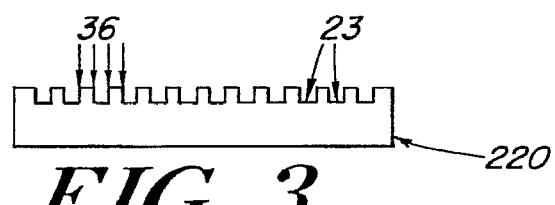
FIG. 3 is a cross sectional view of a chromeless phase shift mask.
Figure 4:
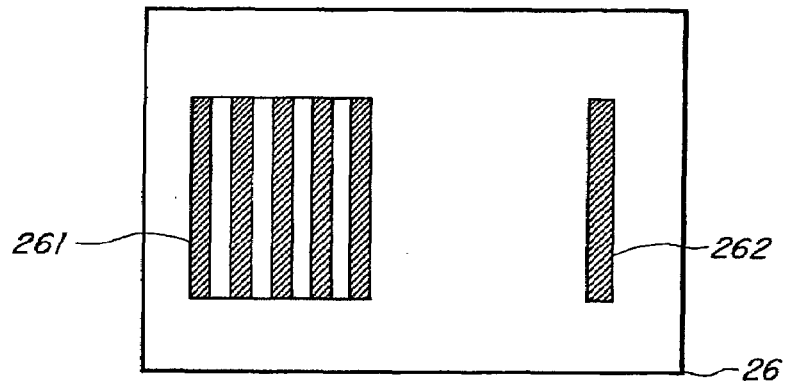
FIG. 4 is an illustration of an optical proximity effect with respect to fabricating lines.
Figure 5:
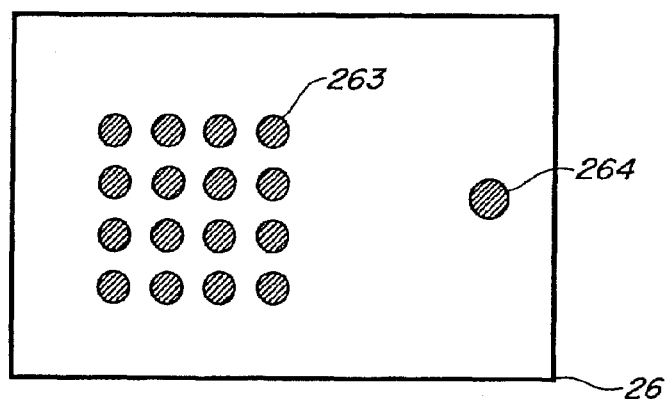
FIG. 5 is an illustration of an optical proximity effect with respect to fabricating contact holes or pillars.
Figure 6:
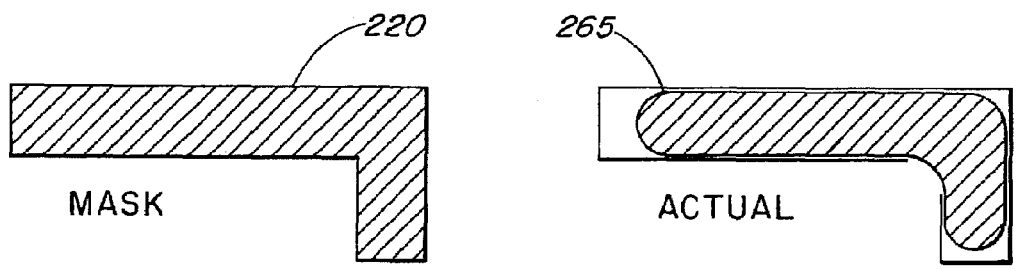
FIG. 6 is an illustration of a spatial frequency effect with respect to fabricating lines.
Figure 7:
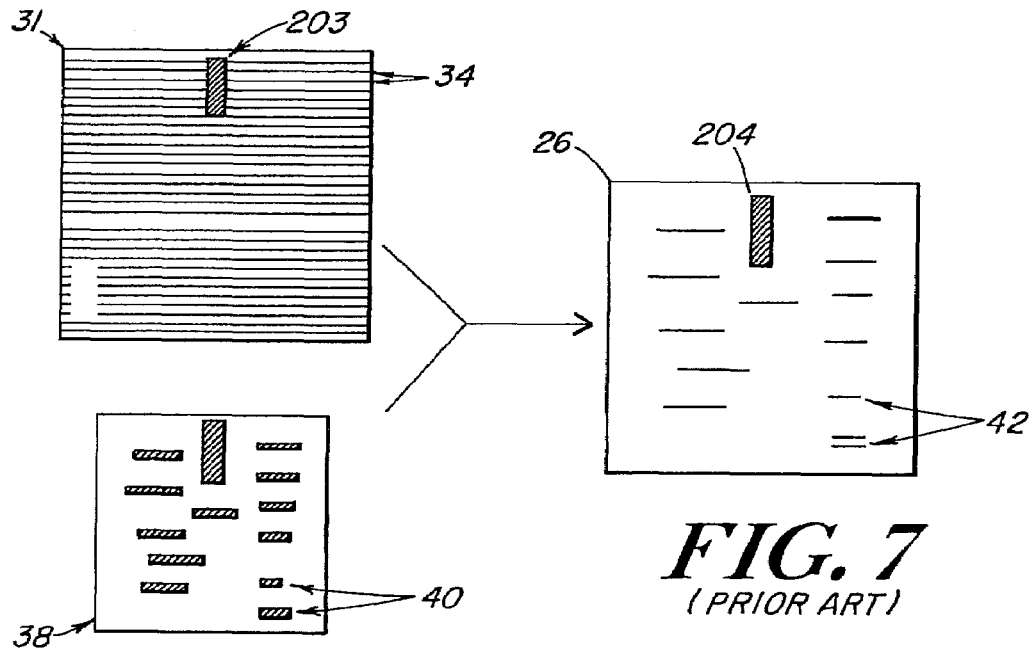
FIG. 7 is a schematic illustration of a prior art double exposure lithography approach.

In a preferred embodiment of the present invention, the dense-feature mask 220 is a phase-shift mask comprising a grating pattern of periodic features. FIGS. 2 and 3 are top and side views, respectively, of a phase-shift mask that is a preferred embodiment of mask 220 used with respect to the present invention. The phase-shift mask 220 may be formed of, for example, fused $SiO_2$. Periodic trenches 23 are formed in the mask 220 to provide an interference pattern upon illumination that results in the desired photoresist pattern 30 on the wafer 26.

Although a simple one-dimensional mask grating is shown in FIGS. 2 and 3, the present invention is applicable to phase-shift masks of a variety of patterns. The present invention is also applicable to other types of phase-shift masks such as alternating aperture (AAPSM) or attenuating phase-shifters (APSM).

A more detailed discussion of these phase-shift masks is set forth in co-pending U.S. patent application Ser. No. 09/952,185, filed on Sep. 13, 2001, entitled "Method Of Design And Fabrication Of Integrated Circuits Using Regular Arrays And Gratings." The entire contents of U.S. patent application Ser. No. 09/952,185, filed on Sep. 13, 2001, are hereby incorporated by reference.

Figure 10:
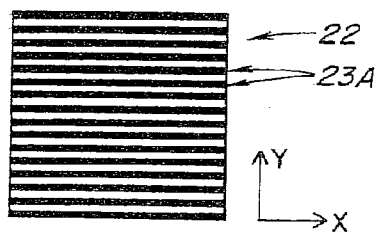
FIGS. 10-13 are top views of various dense-feature mask pattern configurations in accordance with the present invention.
Figure 11:
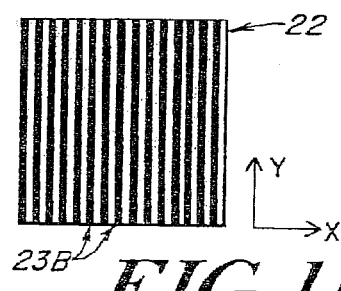
Figure 12:
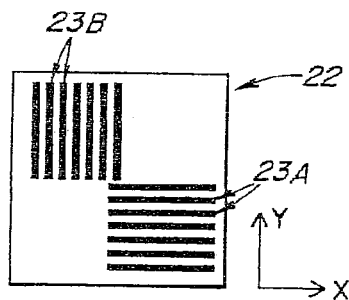

With reference to FIGS. 10-13, the line features 23A, 23B, and 23C can be formed in a variety of configurations. In the configuration of FIG. 10, horizontal line features 23A of mask 2203 are formed parallel to each other in the X-direction, while in FIG. 11, vertical line features 23B of mask 2204 are formed parallel to each other in the Y-direction. The mask shown in FIG. 12 includes features formed in a horizontal orientation 23A in a first region of the mask 2205 and features formed in a vertical orientation 23B in a second region of the mask 2206.

Note, however, that in alternative embodiments, the features may be formed in other patterns, including locally regular patterns. For example, in the mask of FIG. 13, a unique feature pattern 23C is employed. Other such unique combinations of patterns are applicable to the present invention.

Figure 14:
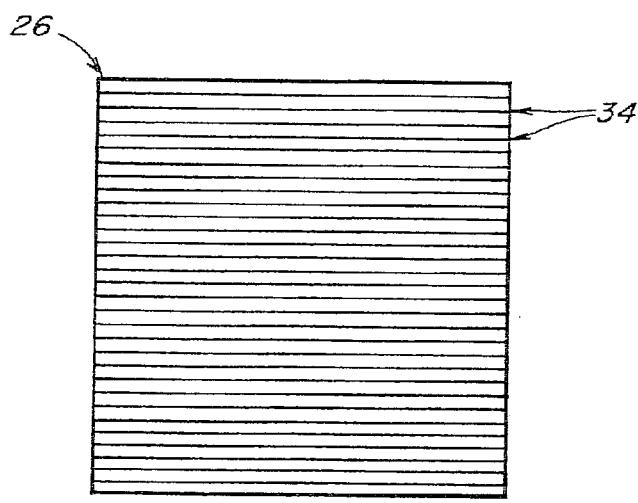
FIG. 14 is a top view of a wafer exposed by the dense feature mask of FIG. 10 in accordance with the present invention.

FIG. 14 is a top view of the resulting pattern formed on the wafer 26, assuming exposure by the dense feature mask 2203 of FIG. 10. A plurality of periodic thin lines 34 of photoresist material is formed on the wafer 26 (in the case of a positive resist). A preferred embodiment of the present invention produces these grating features with a phase-shift mask; however it is noted that the present invention may also use interferometric or imprint definition processes to produce these grating features.

Figure 15:
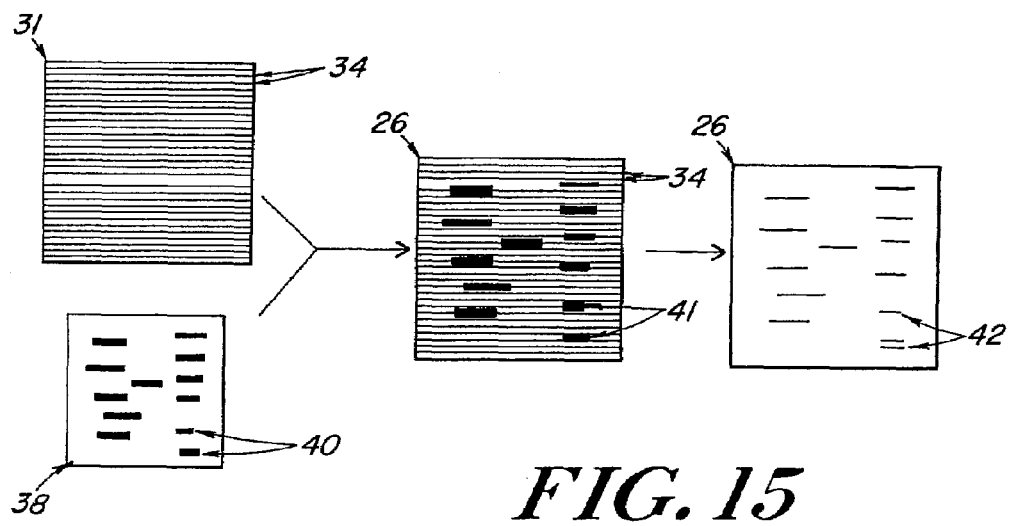
FIG. 15 is a graphical flow diagram illustrating top views of a wafer undergoing a trimming process in accordance with the present invention.
Figure 16:
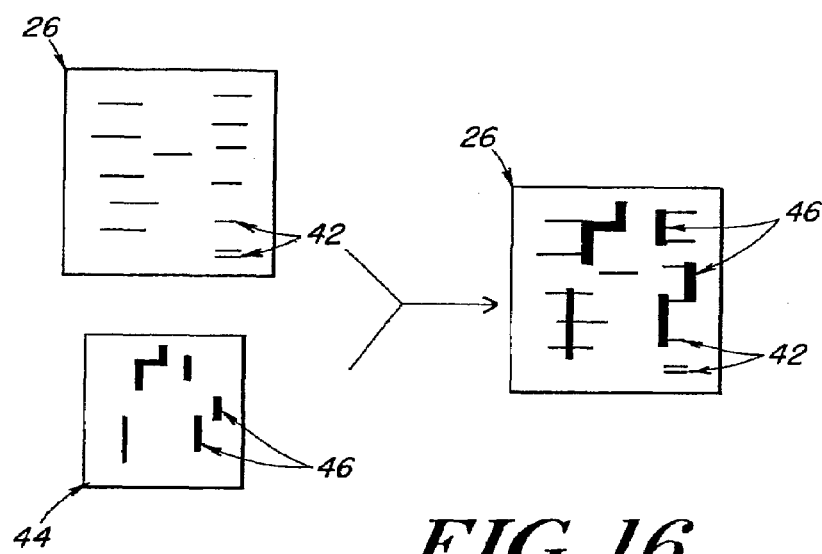
FIG. 16 is a graphical flow diagram illustrating top views of a wafer undergoing an interconnect process in accordance with the present invention.

As noted above, the present invention is directed to fabricating physical structures on a substrate or wafer. FIGS. 15 and 16 graphically illustrate a process for forming these structures according to the concepts of the present invention.

As shown in FIG. 15, a wafer or substrate 26 is exposed using a grating 31 which including a line pattern 34 to provide a pattern of regular dense lines or features of a predetermined pitch and critical dimension on the substrate 26. Thereafter, a trim mask 38, which may include gray-tone features, is exposed on the wafer 26.

It is noted that a pattern of regular dense lines or features of a predetermined pitch and critical dimension on substrate 26 can be formed using interferometric lithography, and a trimming exposure, using trim mask 38 that may include gray-tone features, is performed, thereafter, on the wafer 26 to remove any unwanted pattern features.

It is further noted that the present invention may utilize a template and nanoimprinting to create a pattern of dense lines or features having a predetermined pitch and critical dimension on substrate 26, the pattern of dense features may be locally or globally periodic. In this embodiment, a trimming exposure, using trim mask 38 that may include gray-tone features, is performed on the wafer 26 to remove any unwanted pattern features or to customize the wafer 26.

For example, in the case of transistors having a consistent, narrow gate length, the gate length of each transistor corresponding to the width of each line, trim features 40 are formed on the customized trim mask 38 and exposed on the wafer 26 at corresponding locations 41 to form a resulting trimmed pattern 42, comprising a plurality of transistors of equal gate length along their critical dimension. In this manner, a standardized and relatively inexpensive dense fine feature mask can be used to form the critical dimension of the transistor length under tight tolerance conditions.

This is combined with the customized trim mask 38, which may contain gray-tone features, of relatively loose tolerance constraints to provide a trimmed pattern 42 on the wafer 26. A certain degree of misalignment can be tolerated on the trim mask 38 along with oversize and undersize error in the trim features 40, as well as exposure error. These loose tolerance constraints are acceptable because of the often relatively wide pitch, or distance, between centers of the narrow feature lines 34 and loose tolerance constraints are typical of trim exposures. Additionally, the critical dimension, width, of the feature lines 42 is not determined by the trim-mask features 40. It is generally easier to erase existing features than to accurately place new features. Thus, the present invention is especially amenable to applications involving a dense array of features at a minimal critical dimension.

Following formation of the trimmed pattern 42 on the wafer 26, the exposure of the trimmed pattern 42 is developed according to standard semiconductor chemical processes that alter the chemistry in the photo-resist. Following this, the wafer is subjected to a "hard bake" such that the photoresist is no longer susceptible to light. The wafer is then re-coated with photoresist in preparation for the pattern interconnection process.

With reference to FIG. 16, following formation of the trimmed and developed trim patterns 42 on the wafer 26, the fresh layer of photoresist on the wafer 26 is next exposed by an interconnect mask 44 including interconnect features 46. In this manner, assuming the trimmed pattern 42 represents transistor gates, the interconnect features 46 provide a means for interconnecting the gates 42 so as to form a circuit. Again, in this case, the interconnect mask 44 is custom-designed for the particular circuit to be interconnected.

Since a standard dense feature mask is used to generate patterns of fine lines with a given critical dimension in the circuit, the present invention is immune to optical proximity effects. For example, in the pattern of trimmed features 48 shown in FIG. 17, patterns 49A formed in densely populated region 50 of the pattern of trimmed features 48 and patterns 49B formed in a sparsely populated region 52 of the pattern of trimmed features 48 remote to the densely populated region 50 have identical feature sizes.

Figure 13:
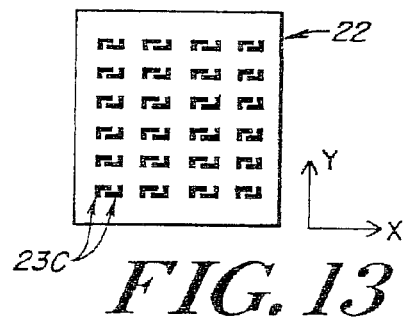

However, assuming the original dense feature mask has more complex pattern, such as the "L"-shaped pattern 23C of FIG. 13, as these features become small, sharp features, such as corners and line-ends tend to become distorted. For this reason, various forms of optical proximity correction or spatial frequency correction features may be configured directly into the dense feature mask template in order to pre-distort the template pattern. For example, well-known techniques such as hammer-heads, serifs, and mouse bites may be added to the corner features so that the exposed final feature resembles the desired feature. By incorporating the optical proximity correction and/or spatial frequency correction directly in the dense feature mask, the standard features are automatically corrected on the dense feature mask rather than on the design-specific trim mask and interconnect mask, thereby providing an economically efficient solution to the optical proximity correction issue.

Figure 18:
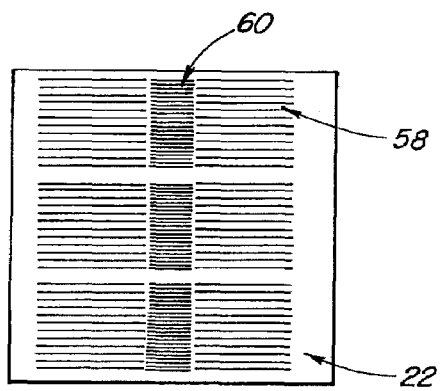
FIG. 18 is a top view of a dense feature mask including both printable features and sub-resolution features in accordance with the present invention.

With reference to FIG. 18, the present invention is also amenable to use with a dense feature mask 227 having sub-resolution gratings 60.

Figure 19:
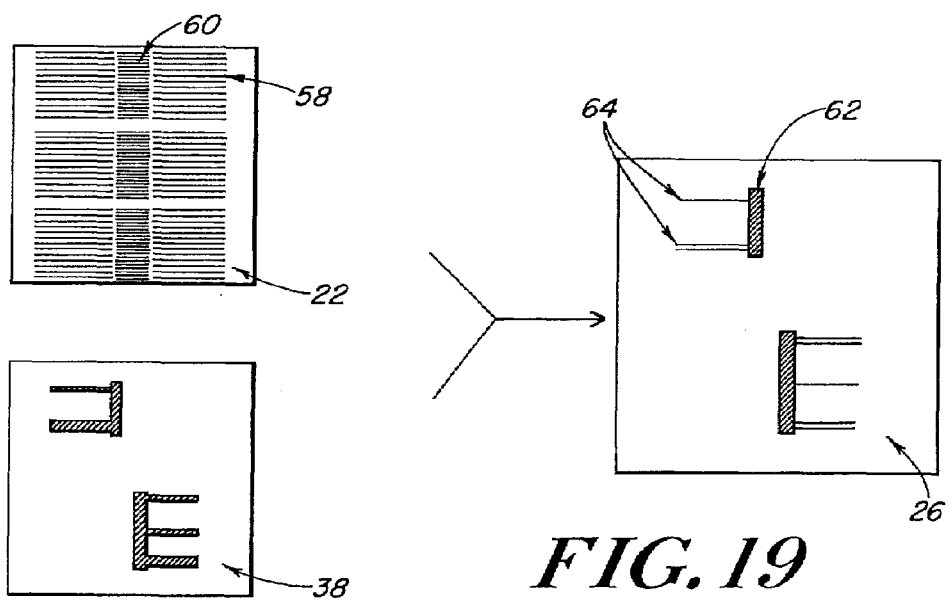
FIG. 19 is a graphical flow diagram illustrating a trimming operation performed on a wafer including solid patterns formed by exposure of the sub-resolution features of the dense feature mask of FIG. 15.

As illustrated in FIG. 19, printable features 58 of the dense feature mask 227 of FIG. 18, when exposed, result in fine features formed on the wafer 26, while the sub-resolution features 60 of the phase-shift mask 227 result in solid patterns on the wafer 26. Through the use of a trim mask 38, which may contain gray-tone features, these solid patterns can be trimmed appropriately so as to form interconnects 62 between the trimmed fine features 64 as shown.

It is noted that a pattern of regular features and solid patterns on substrate 26 can be formed using interferometric lithography, and a trimming exposure, using trim mask 38 that may include gray-tone features, is performed, thereafter, on the wafer 26 to remove any unwanted pattern features.

It is further noted that the present invention may utilize a template and nanoimprinting to create a pattern of regular features and solid patterns on substrate 26. In this embodiment, a trimming exposure, using trim mask 38 that may include gray-tone features, is performed on the wafer 26 to remove any unwanted pattern features or to customize the wafer 26.

Figure 20:
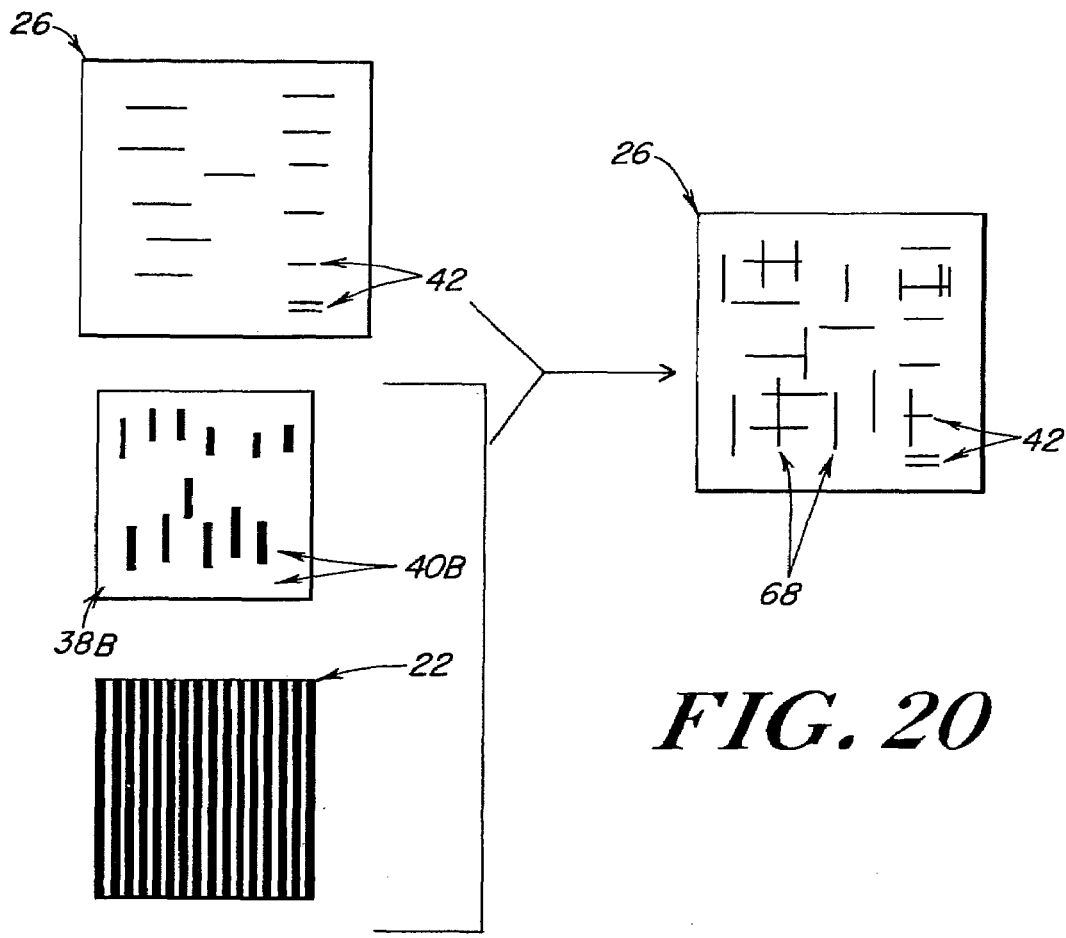
FIG. 20 is a graphical flow diagram illustrating the extension of this method to produce sets of fine features with different orientations and position offsets.

Since the imaging of each set of exposures, in the present invention, is independent of the previous exposures, the method of the present invention can be used to produce fine features such as transistor gates with multiple orientations and/or offsets. This is illustrated in FIG. 20.

With respect to producing fine features with multiple orientations and/or offsets, first the approach illustrated in FIG. 15 is used to create fine features in one orientation.

More specifically, a substrate is photolithographically exposed with a dense-grating mask to provide a first exposed pattern on the substrate. The substrate is then photolithographically exposed with a trim mask to trim the first exposed pattern to provide multiple trimmed patterns 42 on the substrate 26 as illustrated in FIG. 20.

Next, the substrate 26 is recoated with resist and photolithographically exposed with a dense-grating mask 229 with another orientation or offset 23B. Then, the substrate is photolithographically exposed with a trim mask 38B with pattern 40B to trim this second dense grating pattern to provide a second set of multiple trimmed patterns 68 on wafer 26. Thus, two sets of multiple trimmed patterns are formed 42 and 68 each having its own orientation and offset. As an alternative to the second resist coat, a hardmask or double bilayer resist process can also be used in the same manner as described below with respect to FIGS. 16 and 17.

Figure 17:
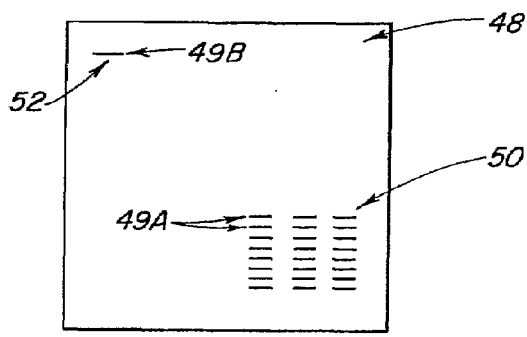
FIG. 17 is a top view of trimmed fine features formed according to the technique of the present invention illustrating the absence of optical proximity effects.

With respect to the processes illustrated in FIGS. 16 and 17, a substrate is first photolithographically exposed with a dense-grating mask to provide a first exposed pattern on the substrate. The substrate is next photolithographically exposed with a trim mask, which may contain gray-tone features, to trim the first exposed pattern to provide multiple trimmed patterns on the substrate. Next, the substrate is recoated with resist and photolithographically exposed with an interconnect mask to provide an interconnect pattern on the trimmed pattern for interconnecting a subset of the multiple trimmed patterns.

As an alternative to the second resist coat, a hardmask or double bilayer resist process can also be used. In a hardmask process, an additional masking layer, typically silicon nitride or silicon dioxide, is formed on the wafer prior to resist coating. This layer is defined and etched to form a mask that can be used in processing of the underlying substrate. In a double bilayer process, two layers of resist are formed such that patterns formed in the top layer of resist are used to locally control the removal of the bottom layer of resist such that a pattern formed in the bottom layer of resist corresponds to the geometric union of multiple exposures.

A less general dense-feature pattern can also be used which eliminates the need for a third exposure.

According to the concepts of the present invention, lithographically exposing the substrate with a dense feature mask provides a first exposed pattern having a predetermined critical dimension. In this case, following photolithographically exposing the substrate again with the trim mask, which may contain gray-tone features, the multiple trimmed patterns have substantially the same critical dimension.

A first subset of the multiple trimmed patterns may be located in a sparsely populated region of the substrate, and a second subset of the multiple trimmed patterns may be located in a densely populated region of the substrate. The first subset and second subset of patterns have substantially the same critical dimension. This is illustrated in FIG. 15 (42) and FIG. 17 (49A and 49B). The multiple trimmed patterns may comprise transistors wherein the critical dimension represents the length of the gate length of each transistor.

The substrate may comprise a semiconductor substrate having a first photo-resist layer, wherein the multiple trimmed patterns are provided in the first photoresist layer, and wherein following photolithographically exposing the substrate with the trim mask, the first photoresist layer is developed. Following developing of the first photoresist layer, a second photoresist layer may be formed over the developed first photoresist layer, in which case, the interconnect pattern is provided in the second photoresist layer.

Another embodiment uses a less general dense-feature pattern on the photomask. This pattern is then "customized" by the second trim exposure into a desired circuit pattern. This embodiment only requires two exposures and does not require a second resist coat. This embodiment is illustrated in FIG. 19.

Other possible embodiments involve the triple-exposure method described above with the second resist replaced by either a hardmask or double bilayer resist process.

The dense-pattern features can be generated by either photomasks or other imaging/patterning methods not necessary produced by optical mask projection methods. Such methods may include laser interferometry or nano-imprint methods. When photomasks are used, a preferred embodiment utilizes phase-shift masks to generate the dense-feature patterns.

In interference lithography, fine features are centered on regions of destructive interference; i.e., nulls. In phase-shift lithography, these nulls correspond to the boundary of a particular transmitting region on a mask, and a second transmitting region with a phase-shift typically of about 180 degrees. In some applications, phase shift masks with phase shifts between zero and ±180 degrees may be used.

An attenuating phase shift mask (APSM) is a phase shift mask in which there are multiple regions. A set of regions is included for which there is a relative phase shift of zero degrees and a transmissivity between zero and one. Other sets of regions have a phase shift typically of about 180 degrees and a transmissivity between zero and one. In some applications, attenuating phase shift masks with phase shifts between zero and ±180 degrees may be used.

In laser interferometry, these nulls correspond to regions of destructive interference of two wavefronts. The critical dimension in resist of interferometrically-defined features (phase-shift or otherwise) is determined primarily by the exposure dose. Thus, for a single exposure in which all features receive the same dose, one critical dimension is defined at each null. Conventionally forming these critical dimensions is not addressed during a single phase-shift exposure. It would be beneficial for multiple fine line critical dimensions to be defined in resist during a single phase-shift or interferometric exposure.

In the present invention, multiple fine line critical dimensions are defined in resist during a single feature definition exposure by adding exposure of a gray-tone mask to locally partially expose different regions of a substrate, thereby allowing for a range of fine line critical dimensions to be defined by the feature definition exposure. This gray-tone mask can be implemented as a mask with varying degrees of transmission or as a pixellated mask with features below the pitch resolution of the stepper that produce a similar dose variation effect. The gray-tone mask exposure may either be the trim exposure or be in addition to the trim exposure of a double exposure PSM process.

To simplify the gray scale mask fabrication process, the stepper resolution can be intentionally worsened or degraded during the gray scale exposure by a detuning method. For example, the detuning can be realized by the partial coherence of the exposure being decreased or the numerical aperture of the lens (NA) being decreased. This detuning permits a larger pixellation pitch to be used on the mask, thus decreasing the mask write time and resolution requirements.

The two most difficult patterning levels in semiconductor processing are transistor gates and contact holes. Attenuating phase-shift masks have been conventionally used to increase the resolution and process latitude for leading edge applications requiring small contact holes. The transmission of these attenuated phase-shift masks has been limited to around 6% due to the problem of sidelobe printing at larger transmission values. In addition, the correction of optical proximity effects is difficult for leading edge contact patterns with complex ternary masks sometimes being used. In addition to considerably increasing mask fabrication complexity, the conventional approaches do not allow for maximum packing density due to the area they consume. An example of a conventional method uses a darkfield mask tone with binary masks with sub-resolution OPC features.

The present invention uses "dense-only" attenuated phase-shift masks to fabricate random contact patterns. The method, according to the concepts of the present invention, involves the use of two exposures. The first exposure uses a dense pillar array, using a brightfield attenuated phase-shift mask, which images a dense array of holes using a negative resist. The brightfield mask tone used is important for improving the process latitude. The second exposure trims out the undesired contact features. The sum of these two exposures produces a random array of holes.

Since only dense contact features are imaged, proximity and sidelobe effects are eliminated. Thus, the use of complex ternary or OPC contact masks is not required. Since sidelobe effects are absent, the use of high transmission attenuated phase-shift masks is possible, greatly improving lithographic performance. In fact, "chromeless" attenuated phase-shift masks can be used where the transmission of the patterned regions is 100%. The present invention uses a brightfield mask tone together with high transmission attenuated phase-shift mask and full exposure doses for each level.

The present invention is also directed to a design methodology. In this methodology, according to the present invention, standard circuit subcell designs are designed or laid out wherein all fine features lie on a regular pattern. The standard circuit subcell designs are compatible with a method of forming patterns on a substrate by exposing the substrate to provide a pattern of regular dense features of a predetermined pitch and critical dimension and exposing the substrate to provide multiple trimmed patterns on the substrate, the trimmed patterns including both densely populated and sparsely populated regions of features, the critical dimension of the features in the densely populated regions and sparsely populated regions being substantially independent of feature density.

In another embodiment, the methodology designs standard circuit subcells wherein all fine features lie on a regular pattern, and the standard circuit subcell designs are compatible with a mask set for providing patterns on a substrate having a fine feature mask containing a pattern of regular dense features and a trim mask for producing multiple trimmed patterns of fine features.

The present invention also contemplates a computer-aided or non-computer aided design methodology. This methodology assumes a first template of dense-only features as a first mask level and places a first set of trim features on a second mask level to coincide with selected features on the first template, such that a first subset or superset of features desired for fabrication correspond to a geometric function of the first template and the first set of trim features. The computer-aided methodology can further place additional features on additional mask levels, such that features desired for fabrication correspond to a geometric function of the first subset or superset of features desired for fabrication and the additional features, the geometric function being determined by a destination lithographic process in which the imaging of the first subset or superset of features desired for fabrication of the trim features and the imaging of the additional features are substantially independent. The placing of additional features can be defined by assuming a second template of dense-only features as a first mask level and placing a second set of trim features on a second mask level to coincide with selected features on the second template, a second subset or superset of features desired for fabrication corresponding to a geometric function of the second template and the second set of trim features; or by placing additional features on additional mask levels, such that features desired for fabrication correspond to a geometric function of the second subset or superset of features desired for fabrication and the additional features, the geometric function being determined by a destination lithographic process in which the imaging of the second subset or superset of features desired for fabrication and the imaging of the additional features are substantially independent.

In a further embodiment of the present invention, the present invention extends the capability of double exposure phase shift lithography. It enables the imaging of multiple fine feature critical dimensions by using gray-tone mask features on either the phase shift or trim masks. This permits the use of chromeless phase shift or interferometric fine feature imaging for a much wider range of applications.

As noted above, a chromeless phase shift mask 220 is shown schematically in FIGS. 2 and 3. In this chromeless phase shift mask 220, features 23 are typically etched into the transparent mask material, which is typically quartz. The depth of these etched features 23 results in a relative phase difference in the illumination that is transmitted on either side of a phase boundary 36. When the relative phase difference is 180 degrees, an interference null corresponding to the phase edge 36 is produced at the image plane, which is typically the substrate 26.

Figure 8:
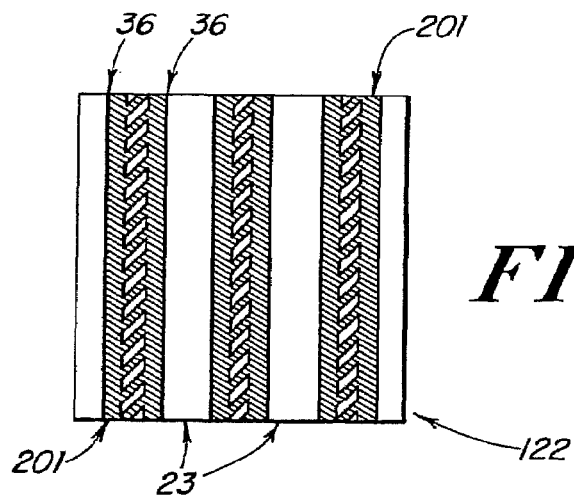
FIG. 8 is a top view schematic of prior art use of chrome regulators to locally modify the critical dimension.
Figure 9:
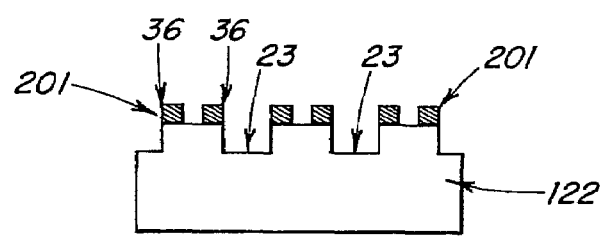
FIG. 9 is a cross sectional view of prior art use of chrome regulators to locally modify the critical dimension.

There are several other varieties of phase shift masks. An alternating aperture phase shift mask, which has chrome regulators at each phase edge, is illustrated in FIGS. 8 and 9. FIG. 8 is a top view and FIG. 9 is a cross sectional view of the alternating aperture phase shift mask, which has chrome regulators at each phase edge. Like the chromeless phase shift mask 220, the alternating aperture phase shift mask 122 has chrome regulators 201 placed at each phase edge 36.

Phase shift masks work by employing the principle of destructive interference of light to generate fine dark lines in photoresist. A phase shift photomask is typically made of quartz ($SiO_2$) in which features are etched to a depth corresponding to a 180 degree phase difference for the illumination light wavelength used. The equation for destructive interference is:

$$d = \lambda/2(n-1) \qquad 2)$$

where d is the etch depth, $\lambda$ is the exposure wavelength and n is the index of refraction of the glass mask at the exposure wavelength. Upon illumination by the lithography apparatus shown in FIG. 1, each feature edge 36 forms a fine dark line in the photoresist 28.

Further as noted above, since these dark line features correspond to phase boundaries 36, dark line features are topologically closed, which has lead to the development of double exposure phase shift methods in order to trim away the undesired fine lines in a second exposure.

Double exposure imaging has become an accepted method in the field of resolution enhancement lithography.

In this method, fine features are typically imaged on a substrate in the first exposure, using a phase shift mask, and other features as well as trimming of undesired phase edges is performed in a second exposure using a trim mask. The phase shift mask may contain additional opaque features. The phase shift mask may be a strong phase mask or a weak phase mask. A strong phase shift mask is a phase shift mask for which ideal dense periodic grating patterns generate no zero-order diffracted light. A weak phase shift mask is a phase shift mask for which ideal dense periodic grating patterns generate some zero-order diffracted light.

As noted above, conventional processes use a chrome-on-glass binary photomask for this trim mask. In this case, chrome regions on the trim mask prevent desired features produced by the phase shift mask from being exposed in the trim exposure.

Multiple critical dimensions are typically formed by varying the width of a chrome regulator structure placed at each phase edge. As feature sizes continue to move ever deeper into the sub-wavelength regime, it becomes increasingly difficult to image a variety of critical dimensions using this method. In addition, chromeless phase shift masks, which have the greatest resolution enhancement potential, cannot be used to image multiple critical dimensions. A similar problem is encountered when interferometric lithography is used.

This embodiment of the present invention places gray-tone features on either the trim or phase shift mask of a double exposure process. A gray-tone mask feature allows zero order light to pass but contains no modulation information (higher order diffraction components). Mathematically, this type of feature has a constraint on the pitch given by: $P<\lambda/NA(1+\sigma)$.

In this expression, $\lambda$ is the exposure wavelength, NA is the lithography lens numerical aperture and $\sigma$ is the lithography illumination partial coherence. Note that modern lithographic exposure tools feature variable NA and $\sigma$ which allow "detuning" of the projection optics in order to relax the minimum pitch requirement. This capability is useful to ease the mask making requirements for gray-tone features. A given gray-tone intensity can be achieved by a variety of feature shapes and placement algorithms satisfying the pitch constraint above.

Figure 21:
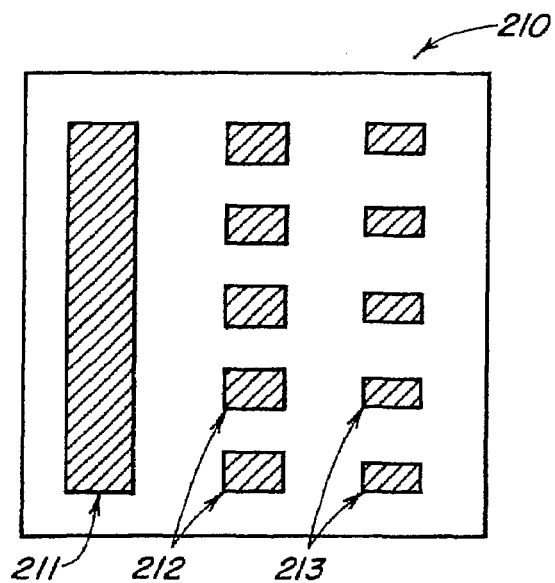
FIG. 21 is a top view schematic of one embodiment of a gray-tone trim mask according to the concepts of the present invention.
Figure 22:
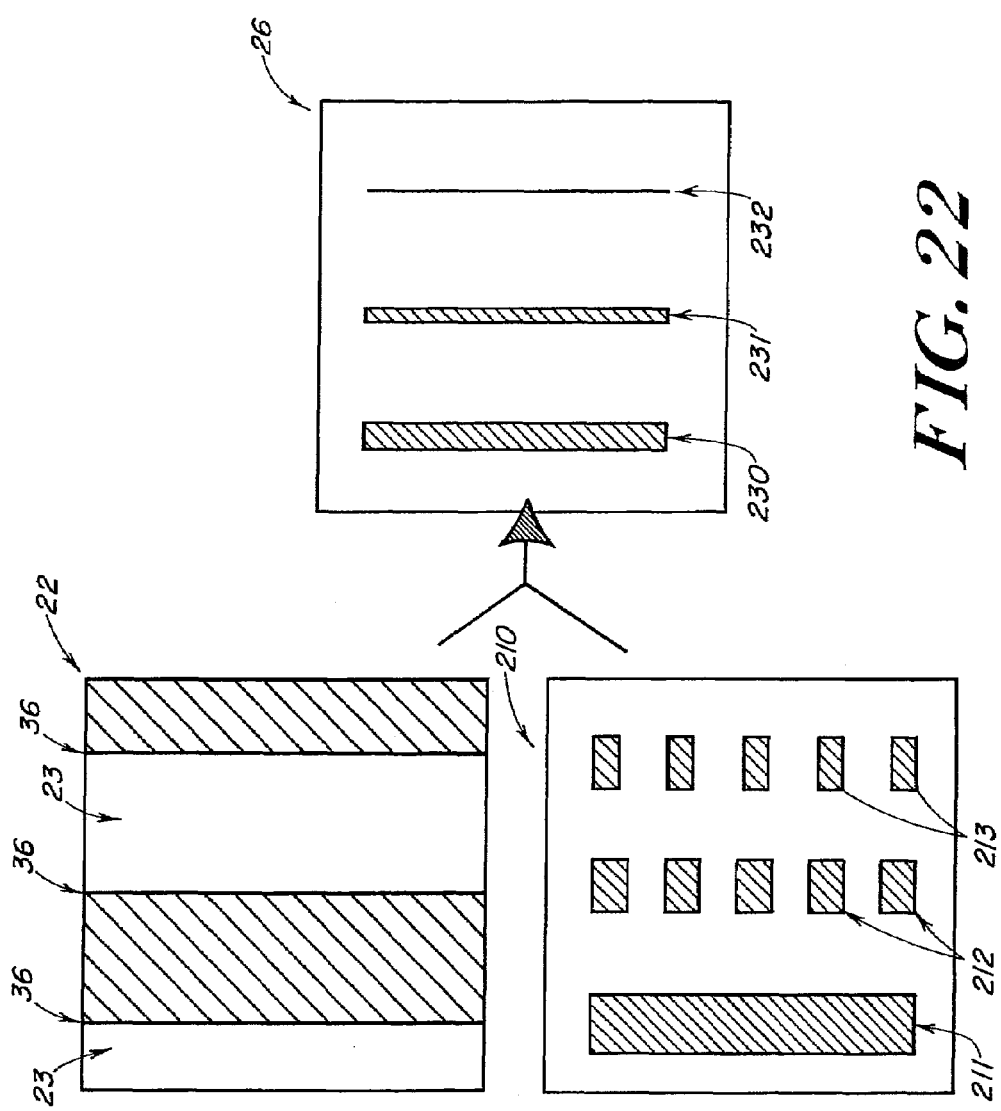
FIG. 22 is a schematic of a double exposure phase shift process using the gray-tone trim mask of FIG. 21 to locally modify the critical dimension, according to the concepts of the present invention.

An example of this embodiment of the present invention is illustrated schematically in FIGS. 21 and 22. FIG. 21 shows an example of one embodiment of a gray-tone trim mask 210. This gray-tone mask 210 includes solid opaque features 211, and sub-resolution features 212 and 213 of various widths and spacings. For this example, the sub-resolution features 212 have a pitch, P1, and the sub-resolution features 213 have a pitch, P2. This type of gray-tone mask may be referred to as a pixellated gray-tone mask.

FIG. 22 shows a double exposure lithography process using the pixellated gray-tone trim mask 210 for the trim exposure. In this example, a chromeless phase shift mask 225 is used for imaging the fine features or dense fine features. The trim mask 210 is designed so that the pixellated gray-tone regions 211, 212, and 213 have positions that are a function of the phase edge position 36. These pixellated gray-tone regions 211, 212, and 213 will prevent the fine features or dense fine features corresponding to the interference null at phase edge 36 from being removed in the trim exposure.

The variation in transmissivity results in local variation of critical dimension. For example, the solid opaque region on trim mask 210 results in a feature on the substrate 26 with critical dimension 230. The region 212 on trim mask 210 with pitch, P1, results in a feature on the substrate 26 with critical dimension 231. The region 213 on trim mask 210 with pitch, P2, results in a feature on the substrate 26 with critical dimension 232. By varying the gray-tone transmission value, a wide range of near minimum width critical dimension features can be imaged in a single die.

In this embodiment, sub-resolution pixels of various widths and spacings are used to produce gray-tones. The gray-tone regions are positioned in locations corresponding to those features that are to be preserved in the trim exposure. These gray-tone features may be formed using pixellation.

Figure 23:
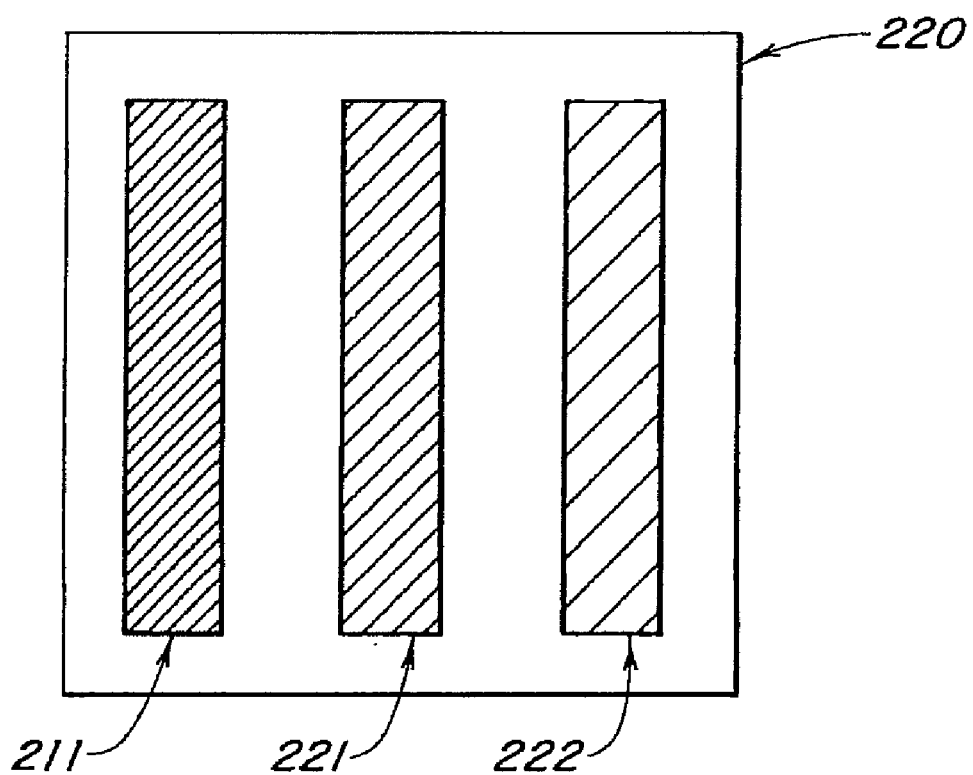
FIG. 23 is a top view schematic of another embodiment of a gray-tone trim mask according to the concepts of the present invention.
Figure 24:
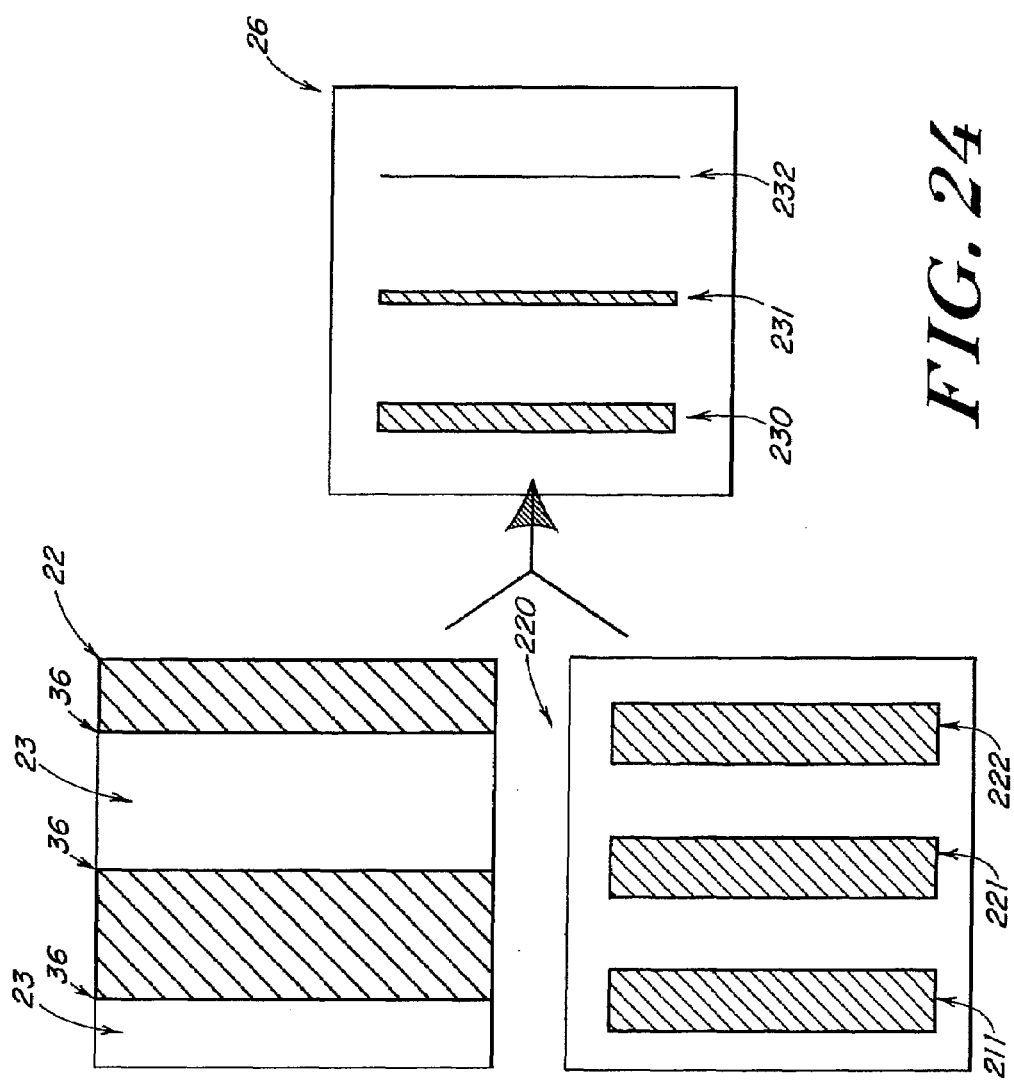
FIG. 24 is a schematic of a double exposure phase shift process using the gray-tone trim mask of FIG. 23 to locally modify the critical dimension, according to the concepts of the present invention.

Another embodiment of the present invention is shown schematically in FIGS. 23 and 24. This embodiment of the present invention uses continuously variable mask transmission to implement the gray-tone function. This is in place of the mask pixellation utilized in the previous embodiments discussed above. Such types of masks are available for example under the "HEBS" (high energy beam sensitive glass) name.

An example of a variable transmission mask is shown in FIG. 23. This trim mask 2100 has three non-background regions 211, 221, and 222 that have different transmissivities.

FIG. 24 shows this mask applied to a double exposure process. Note that the regions 211, 221, and 222 on the trim mask 2100 when combined with the phase shift mask 2201 in a double exposure, result in features 230, 231, and 232 on the substrate 26 with different critical dimensions.

In this embodiment, gray-tone regions of various transmissivities are used. The gray-tone regions are positioned in locations corresponding to those features that are to be preserved in the trim exposure. Moreover, the transmissivity of each region may be between one and zero, inclusive.

In a further embodiment of the present invention, interferometric lithography is used to pattern the fine features and a second trim exposure with gray-toning is used to locally vary the critical dimension. In this embodiment, the interference nulls produced by interferometry are used to form the fine features.

In a still further embodiment of the present invention, an imprint process is used to pattern the fine features and a second trim exposure with gray-toning is used to locally vary the critical dimension or to customized the substrate being formed by the imprinting of a master template of fine features. In this embodiment, a pattern on a substrate is imprinted using a master template. Thereafter, the substrate is exposed so as to change or customize the substrate. In a preferred embodiment of the above described imprint process, the substrate is photolithographically exposed.

The present invention may also use a trim mask when exposing the imprinted substrate wherein the trim mask may be a gray-tone mask. The features on the gray-tone mask may be regions of various transmissivities, pixellated regions, or sub-resolution features.

It is further noted that the sub-resolution features are features that are not resolvable for a particular configuration of an exposure system. Moreover, according to the concepts of the present invention, an exposure system's parameters are separately optimized for each of the double exposure processes. The partial coherence of an exposure system can also be detuned, thereby allowing for larger sub-resolution features on the mask. The numerical aperture of an exposure system can also be decreased, thereby allowing for larger sub-resolution features on the mask.

Furthermore, the combined exposure dose locally causes a reaction in the resist layer, and the reaction in the resist layer is dependent on the combined exposure dose. The reaction in the resist layer is used to form features in the resist layer, and each feature in the resist layer may have a desired critical dimension. The critical dimension of each feature may be determined by the design of the gray-tone mask.

The features in the resist layer may correspond to transistor gates, interconnect features, contact features, via features, or isolation features. The resist layer may be a positive or negative resist layer.

In a still further embodiment of the present invention, a mask is designed in which a primary exposure is assumed. The mask is designed by placing gray-tone features on a layout of the mask to locally adjust an exposure dose in regions corresponding to features defined in the primary exposure and placing other features on the layout of the mask. The features defined in the primary exposure may be partially defined. The primary exposure may use a phase shift mask. The local adjustment of the exposure dose may result in a local adjustment of critical dimension. The phase shift mask of the primary exposure may include gray-tone features. The gray-tone features may be formed by pixellation and have regions with different transmissivities wherein the transmissivity of each region is between one and zero, inclusive. Moreover, the gray-tone features may correspond to regions with sub-resolution features, which when exposed produce regions of varying intensity at a substrate plane. The sub-resolution features may be features that are not resolvable for a particular configuration of an exposure system.

Another aspect of the present invention is the actual designing of the features on a gray-tone mask. In this embodiment, a computer aided design software package is used to design the mask. A user specifies; using a user input device such as a mouse, keyboard, touch pad, touch screen, or microphone or the user may specify by using or inputting a data file or data stream containing the relevant location, dimensional, relational, and/or geometric data; the geometric properties; such as location, critical dimension, orientation, a spatial representation in two dimensions, a spatial representation in three dimensions, width dimensions length dimensions, thickness or height dimensions, sidewall angles, curvatures, tapers, or any other dimensional, relational, or geometric property of a substrate feature; of each desired substrate feature or features. From the user specified geometric properties of the desired substrate feature or features; the mask features of a gray-tone mask are automatically determined. These determined mask features could then be formed in an actual gray-tone mask.

These determined mask features could be mask features associated with a phase shift mask or a binary mask. The determined mask features can also be gray-tone features, regions of varying transmissivity, pixellated regions, or sub-resolution features.

The mask features may be determined in an automated manner using an optical simulation engine or using geometry-based rules.

It is noted that the computer aided design software package can also contemplate the use of a template feature placement when determining the mask features. In summary, the present invention is directed to an imaging approach that overcomes the limitations of the conventional techniques, and confers a number of advantages. Optical proximity effects are effectively eliminated, thereby eliminating the need for costly and complex optical proximity correction.

Spatial frequency effects such as corner rounding and line-end shortening are minimized as well through the use of multiple, substantially independent optical exposures. These attributes allow for maximum pattern density and flexibility for applications.

Moreover, the present invention is also directed to a method of imaging multiple critical dimension features in multiple exposure lithography. The use of chrome regulator features is not required by some embodiments of the present invention. Therefore, some embodiments of the present invention permit the imaging of multiple critical dimension features using either chromeless phase shift or interferometric lithography by using gray-tone features on either the phase-shift or trim mask to locally control the critical dimension. The gray-tone features transmit zero order light, but contain no modulation information.

In accordance with the concepts of the present invention, superior dimension control is provided through pitch. The entire fine-line imaging process can be optimized for "dense-only" features thus permitting densities otherwise unachievable. Mask fabrication and inspection is simplified through the use of potentially re-usable regular feature arrays, thus lowering cost. The circuit design cycle is also shortened since library cells may be pre-characterized in a manner that is independent of cell placement.

The present invention forms dense and regular features and remove those that are undesirable, thereby avoiding simultaneously creating dense and isolated features. This is useful for patterns involving sub-wavelength feature sizes and narrow pitch values. In a preferred embodiment, the reticle is patterned to provide a regular array of densely populated narrow features on the wafer that are consistent in size and shape. A trimming process is then used to remove undesired features.

The present invention also avoids circuit density penalties resulting from constraint of fine features in which tight size tolerance is essential to one orientation and grid position offset by adequately providing for the geometric union of exposures at the wafer plane and allowing certain exposures or sets of exposures to have imaging that is substantially independent from that of previous exposures or sets of exposures.

As noted before, the above description refers to gate patterns made using positive photoresist. The same process with negative photoresist will make "trench" patterns useful for damascene gate applications for example. The preferred embodiment also utilizes a phase-shift mask to produce the dense features. These dense regular features could also be produced with other, non-optical mask projection methods such as laser interferometry or imprint/embossing methods.

One preferred embodiment describes the layout and fabrication of narrow line features that could represent transistor gate features. Alternate embodiments of the same method can be used to produce random contact hole or pillar arrays. These methods could form a dense contact/pillar pattern by multiple exposures of dense feature patterns with different offsets and/or orientations. Alternatively, dense contact patterns can be formed by an attenuated phase-shift mask and subsequently trimmed to form a random array. The resist's tone determines whether contacts or pillars are formed in this way.

Another preferred embodiment describes a dual resist process. Alternative embodiments could utilize either a hardmask process, in which an additional masking layer, typically silicon nitride or silicon dioxide, is formed on the wafer prior to resist coating, this layer being defined and etched to form a mask that can be used in processing of the underlying substrate; or double bilayer resist processes in which two layers of resist are formed, such that patterns formed in the top layer of resist mask correspond to removal of the bottom layer of resist and a pattern formed in the bottom layer of resist corresponds to the geometric union of multiple exposures.

Any multiple layer resist process, in which the photo-induced reaction of a particular layer is substantially independent of the photo-induced reaction of another layer, can be utilized with the present invention. Also, any resist process in which multiple substantially independent photo-induced reactions occur within the same layer of resist can be used.

Lastly, the present invention provides a method to locally vary the critical dimension through the use of gray-tone mask features either on the fine feature or trim exposure masks in a multiple exposure lithography process.

Although the various concepts of the present invention have been described above primarily using double exposure photolithography examples, the various described concepts of the present invention are also equally applicable to interferometric processes or nanoimprint processes.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A computer aided design method for designing a mask, comprising:
   (a) specifying, through an input of a user, a geometric property of a desired substrate feature; and
   (b) determining automatically, based upon the user specified geometric property of the desired substrate feature, mask features for a gray-tone mask.

2. The computer aided design method as claimed in claim 1, wherein the determined mask features correspond to mask features on a phase shift mask.

3. The computer aided design method as claimed in claim 1, wherein the determined mask features correspond to mask features on a binary mask.

4. The computer aided design method as claimed in claim 2, wherein some of the determined mask features on the phase shift mask are gray-tone features.

5. The computer aided design method as claimed in claim 4, wherein the gray-tone features are regions of varying transmissivity.

6. The computer aided design method as claimed in claim 4, wherein the gray-tone features are pixellated regions.

7. The computer aided design method as claimed in claim 4, wherein the gray-tone features are sub-resolution features.

8. The computer aided design method as claimed in claim 1, wherein the mask features are regions of various transmissivities.

9. The computer aided design method as claimed in claim 1, wherein the mask features are pixellated regions.

10. The computer aided design method as claimed in claim 1, wherein the mask features are sub-resolution features.

11. The computer aided design method as claimed in claim 1, wherein the mask features are derived in an automated manner using an optical simulation engine.

12. The computer aided design method as claimed in claim 1, wherein the mask features are derived in an automated manner using geometry-based rules.

13. The computer aided design method as claimed in claim 1, wherein a template is utilized in feature placement.

14. The computer aided design method as claimed in claim 4, wherein the mask features are derived in an automated manner using an optical simulation engine.

15. The computer aided design method as claimed in claim 4, wherein the mask features are derived in an automated manner using geometry-based rules.

16. The computer aided design method as claimed in claim 1, wherein the desired geometric property is a critical dimension of the desired substrate feature.

17. The computer aided design method as claimed in claim 1, wherein the desired geometric property is a location of the desired substrate feature.

18. The computer aided design method as claimed in claim 1, wherein the desired geometric property is orientation of the desired substrate feature.

19. The computer aided design method as claimed in claim 1, wherein the desired geometric property is a spatial representation in two dimensions of the desired substrate feature.

20. The computer aided design method as claimed in claim 1, wherein the desired geometric property is a spatial representation in three dimensions of the desired substrate feature.

21. The computer aided design method as claimed in claim 1, wherein the desired geometric property is a width dimension of the desired substrate feature.

22. The computer aided design method as claimed in claim 1 wherein the desired geometric property is a length dimension of the desired substrate feature.

23. The computer aided design method as claimed in claim 1, wherein the desired geometric property is a thickness dimension of the desired substrate feature.

24. The computer aided design method as claimed in claim 1, wherein the desired geometric property is a sidewall angle of the desired substrate feature.

25. The computer aided design method as claimed in claim 1, wherein the desired geometric property is a curvature of the desired substrate feature.

26. The computer aided design method as claimed in claim 1, wherein the desired geometric property is a taper of the desired substrate feature.

27. The computer aided design method as claimed in claim 1, wherein the desired geometric property is input by the user using an input/output device.

28. The computer aided design method as claimed in claim 1, wherein the desired geometric property is input by the user using a data file.

29. The computer aided design method as claimed in claim 1, wherein the desired geometric property is input by the user using a data stream.

* * * * *